(12) United States Patent
Brodie et al.

(10) Patent No.: US 8,253,119 B1
(45) Date of Patent: Aug. 28, 2012

(54) WELL-BASED DYNAMIC PATTERN GENERATOR

(75) Inventors: Alan D. Brodie, Palo Alto, CA (US); Paul Petric, Pleasanton, CA (US); Mark A. McCord, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 485 days.

(21) Appl. No.: 12/510,049

(22) Filed: Jul. 27, 2009

(51) Int. Cl.
*G01N 23/00* (2006.01)
*G21K 1/02* (2006.01)
*G21K 1/08* (2006.01)

(52) U.S. Cl. ............. 250/492.22; 250/492.2; 250/492.1; 250/492.3; 250/306; 250/396 R; 716/54

(58) Field of Classification Search ............. 250/492.22, 250/492.2, 492.1, 492.3, 306, 396 R; 716/54
See application file for complete search history.

(56) References Cited

U.S. PATENT DOCUMENTS

| | | | |
|---|---|---|---|
| 6,177,218 B1 | 1/2001 | Felker et al. | |
| 6,207,965 B1 | 3/2001 | Koike | |
| 6,235,450 B1 | 5/2001 | Nakasuji | |
| 6,291,119 B2 | 9/2001 | Choi et al. | |
| 6,333,508 B1 | 12/2001 | Katsap et al. | |
| 6,414,313 B1 | 7/2002 | Gordon et al. | |
| 6,429,443 B1 | 8/2002 | Mankos et al. | |
| 6,511,048 B1 | 1/2003 | Sohda et al. | |
| 6,525,328 B1 | 2/2003 | Miyoshi et al. | |
| 6,573,516 B2 | 6/2003 | Kawakami | |
| 6,586,733 B1 | 7/2003 | Veneklasen et al. | |
| 6,605,811 B2 | 8/2003 | Hotta et al. | |
| 6,610,890 B1 | 8/2003 | Garcia et al. | |
| 6,657,211 B2 | 12/2003 | Benner | |
| 6,674,086 B2 | 1/2004 | Kamada | |
| 7,061,591 B2 | 6/2006 | Bleeker et al. | |
| 7,091,486 B1 * | 8/2006 | McCord et al. ............... | 250/311 |
| 7,755,061 B2 * | 7/2010 | Grella et al. ............... | 250/396 R |
| 7,816,655 B1 * | 10/2010 | Hess et al. ................. | 250/492.2 |
| 8,089,051 B2 * | 1/2012 | Grella et al. ............. | 250/396 R |
| 2003/0210383 A1 | 11/2003 | Bjorklund et al. | |
| 2009/0114837 A1 | 5/2009 | Grella et al. | |

FOREIGN PATENT DOCUMENTS

| | | |
|---|---|---|
| EP | 1510848 | 2/2005 |
| JP | 4294319 | 10/1992 |

\* cited by examiner

*Primary Examiner* — Nikita Wells
(74) *Attorney, Agent, or Firm* — Okamoto & Benedicto LLP (57) ABSTRACT

One embodiment relates to an apparatus of a dynamic pattern generator for reflection electron beam lithography. The apparatus includes a plurality of base electrodes in a two-dimensional array, an insulating border surrounding each base electrode so as to electrically isolate the base electrodes from each other; and a sidewall surrounding each base electrode. The sidewall comprises a plurality of stacked electrodes which are separated by insulating layers. In addition, the base electrodes are advantageously shaped so as to be concave. Furthermore, a conformal coating may be advantageously applied over the base electrodes and sidewalls. Another embodiment relates to an apparatus for reflection electron beam lithography. The apparatus includes a shadow mask configured to form an array of incident electron beamlets. The shadow mask comprises an array of holes which correspond one-to-one with an array of pixel pads of an electron reflective patterned structure. Other embodiments, aspects and features are disclosed.

15 Claims, 10 Drawing Sheets

WELL-BASED DYNAMIC PATTERN GENERATOR

GOVERNMENT LICENSE RIGHTS

The U.S. Government has a paid-up license in this invention and the right in limited circumstances to require the patent owner to license others on reasonable terms as provided for by the terms of Contract No. HR0011-07-9-0007 awarded by the Defense Advanced Research Projects Agency.

CROSS-REFERENCE TO RELATED APPLICATION(S)

The present application is related to U.S. patent application Ser. No. 11/983,069, filed Nov. 7, 2007 by Luca Grella, Leonid Baranov, and Yehiel Gotkis, the disclosure of the aforementioned application is hereby incorporated by reference.

BACKGROUND

1. Technical Field

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

SUMMARY

One embodiment relates to an apparatus of a dynamic pattern generator for reflection electron beam lithography. The apparatus includes a plurality of base electrodes in a two-dimensional array, an insulating border surrounding each base electrode so as to electrically isolate the base electrodes from each other; and a sidewall surrounding each base electrode. The sidewall comprises a plurality of stacked electrodes which are separated by insulating layers. In addition, the base electrodes are advantageously shaped so as to be concave. Furthermore, a conformal coating may be advantageously applied over the base electrodes and sidewalls.

Another embodiment relates to an apparatus for reflection electron beam lithography. The apparatus includes an electron source configured to emit electrons, illumination electron-optics configured to receive the emitted electrons and form an array of incident electron beamlets, an electron reflective patterned structure having a plurality of pixel pads in an array and an insulating border surrounding each pixel pad so as to electrically isolate the pixel pads from each other, and a stage to hold a target substrate. A shadow mask is advantageously configured to form the array of incident electron beamlets. The shadow mask comprises an array of holes which correspond one-to-one with the array of pixel pads of the electron reflective patterned structure.

Another embodiment relates to a method of imprinting a lithographic pattern onto a target substrate. The method includes forming an incident electron beam, passing the incident electron beam through a shadow mask which comprises an array of holes so as to form an array of electron beamlets, and directing the electron beamlets to a dynamically patterned structure having conductive pixel pads which correspond one-to-one with the array of holes of the shadow mask. Electrons are reflected from a first set of pixel pads of the dynamically patterned structure having a lower or more negative voltage level applied thereto and are absorbed or deflected from a second set of pixel pads of the dynamically patterned structure having a higher or more positive voltage level applied thereto. The reflected electrons are deflected towards a target substrate to imprint a lithographic pattern.

Other embodiments, aspects and feature are also disclosed.

DETAILED DESCRIPTION

Maskless Reflection Electron Beam Lithography

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current density exceeds a certain threshold, electron-electron interactions cause the beam to blur.

This patent application relates to a system and method of electron beam lithography that overcomes the above-discussed disadvantages and problems. Rather than focusing the electron beam into a tiny spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, that approach has various difficulties, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system is not normally buildable using integrated circuits because such integrated circuits are opaque to electrons.

The system and method disclosed herein re-directs the beam (or array of beamlets) out of the direct line of sight between the electron source and the semiconductor wafer. Independently-controllable voltages are applied to cells of a dynamic pattern generator array that may be implemented using integrated circuit technology. The voltages determine whether each cell reflects electrons onto the wafer or absorbs electrons (preventing them from being reflected onto the wafer).

The system and method disclosed herein advantageously breaks through the traditional EBDW speed-versus-resolution tradeoff by illuminating a large area and simultaneously exposing a multitude of pixels on the wafer. For example, four million pixels may be exposed using a 4000×1000 array of individually addressable elements. This may be achieved using a single column and a conventional electron source.

Figure 1:
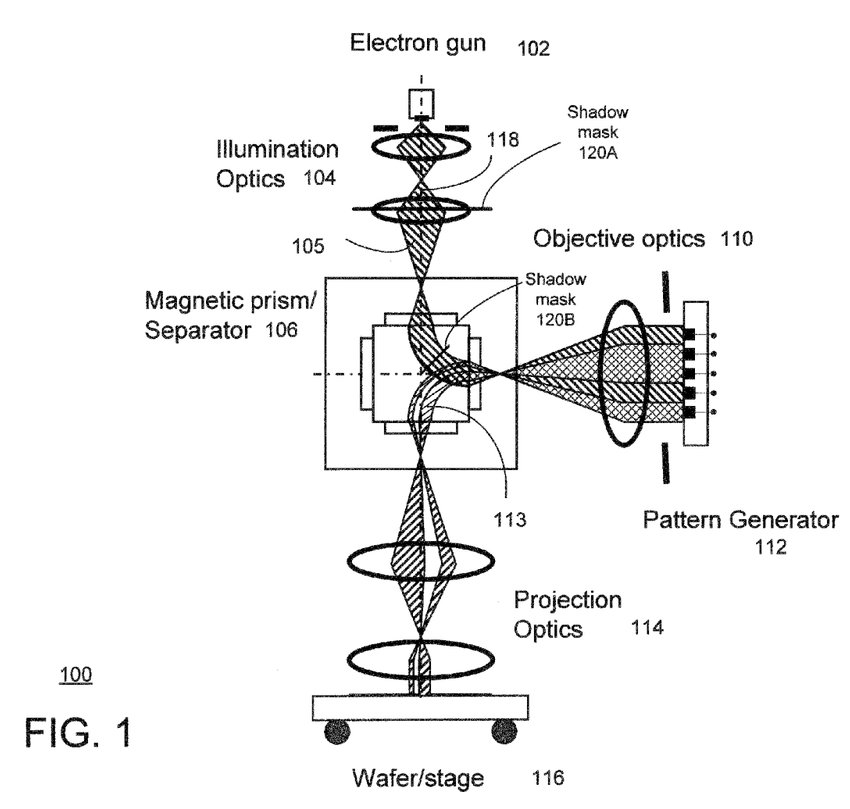
FIG. 1 is a schematic diagram of a maskless reflection electron beam projection lithography system in accordance with an embodiment of the invention.

FIG. 1 is a schematic diagram of a maskless reflection electron beam projection lithography system 100 in accordance with an embodiment of the invention. The name may be abbreviated to a reflection electron beam lithography or REBL system. As depicted, the system 100 includes an electron source 102, illumination electron-optics 104, a magnetic prism 106, an objective electron lens 110, a dynamic pattern generator (DPG) 112, projection electron-optics 114, and a stage 116 for holding a wafer or other target to be lithographically patterned. In accordance with an embodiment of the invention, the various components of the system 100 may be implemented as follows.

The electron source 102 may be implemented so as to supply a large current at low brightness (current per unit area per solid angle) over a large area. The large current is to achieve a high throughput rate. Preferably, the material of the source 102 will be capable of providing a brightness of about $10^4$ or $10^5$ A/cm$^2$ sr (Amperes per cm$^2$ steradian). One implementation uses $LaB_6$, a conventional electron emitter, which typically have a brightness capability of about $10^6$ A/cm$^2$ sr, as the source material. Another implementation uses tungsten dispenser emitters, which typically have a brightness capability of about $10^5$ A/cm$^2$ sr when operating at 50 kilovolts, as the source material. Other possible emitter implementations include a tungsten Schottky cathode, or heated refractory metal disks (i.e. Ta).

The electron source 102 may be further implemented so as to have a low energy spread. The REBL system 100 should preferably control the energy of the electrons so that their turning points (the distance above the DPG 112 at which they reflect) are relatively constant, for example, to within about 100 nanometers. To keep the turning points to within about 100 nanometers, the electron source 102 would preferably have an energy spread no greater than 0.5 electron volts (eV). $LaB_6$ emitters have typical energy spreads of 1 to 2 eV, and tungsten dispenser emitters have typical energy spreads of 0.2-0.5 eV. In accordance with one embodiment of the invention, the source 102 comprises a $LaB_6$ source or tungsten Schottky emitter that is operated a few hundred degrees C. below its normal operating temperature to reduce the energy spread of the emitted electrons. However, cooler operating temperatures can destabilize the source 102, for example, due to impurities settling on the source surface and thereby diminishing its reliabilty and stability. Therefore, the source material may be preferably selected to be a material in which impurities are unlikely to migrate to the surface and choke off emission. Moreover, the vacuum on the system may be made stronger to overcome the impurity problem. Conventional lithography systems operate at a vacuum of $10^{-6}$ Torr. A scanning electron microscope (SEM) with a $LaB_6$ source typically operates at $10^{-7}$ Torr. A SEM with a Schottky emitter typically operates at $10^{-9}$ Torr or better in the gun region. In accordance with one implementation, the REBL operates with a gun region vacuum of $10^{-9}$ Torr or lower to protect the stability of the source 102.

The illumination electron-optics 104 is configured to receive and collimate the electron beam from the source 102.

The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102. The specific details of the arrangement of lenses depend on specific parameters of the apparatus and may be determined by one of skill in the pertinent art.

Figure 10:
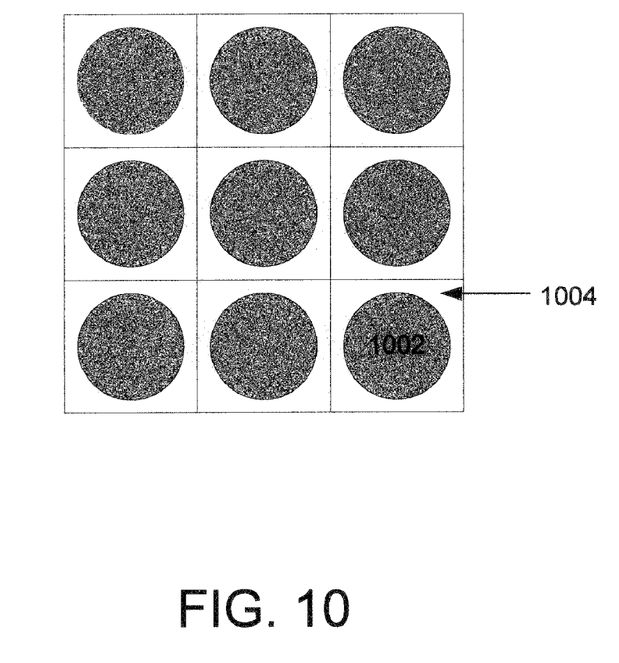
FIG. 10 is a schematic diagram showing a top down schematic view of a portion of a shadow mask in accordance with an embodiment of the invention.

In accordance with an embodiment of the invention, a shadow mask 120 is configured at an image plane (120A) in the illumination optics 104 or a conjugate image plane (120B) in the magnetic prism/separator 106. A top down schematic view of a portion of the shadow mask 120 is shown in FIG. 10, which is discussed below. The shadow mask 120 includes an array of holes which may be illuminated on one side using a flood beam 118 of electrons from the source. This creates an array of beamlets 105 on the other side of the shadow mask. The array of beamlets is preferably configured such that each well in the pattern generator 112 is illuminated by a corresponding beamlet. Herein, the array of beamlets created by the shadow mask 120 may be referred to in the aggregate as "the incident beam."

The magnetic prism 106 is configured to receive the incident beam 105 from the illumination optics 104. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 105 is bent towards the objective lens 110 and the dynamic pattern generator 112. In one embodiment, the magnetic prism 106 is configured with a non-uniform magnetic field so as to provide stigmatic focusing, for example, as disclosed in U.S. Pat. No. 6,878,937 to Marion Mankos, entitled "Prism Array for Electron Beam Inspection and Defect Review." A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112. In one specific implementation, the objective lens 110 may be implemented to operate with a system operating voltage of 50 kilovolts. Other operating voltages may be used in other implementations.

The dynamic pattern generator 112 comprises an array of pixels. Each pixel may comprise a metal contact to which a voltage level is controllably applied. The principle of operation of the DPG 112 is described further below in relation to FIGS. 3A and 3B.

The extraction part of the objective lens 110 provides an extraction field in front of the DPG 112. As the reflected electrons 113 leave the DPG 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics 114 reside between the prism 106 and the wafer stage 116. The projection optics 114 is configured to focus the electron beam and demagnify the beam onto photoresist on a wafer or onto another target. The demagnification may range, for example, from 1× to 20× demagnification (i.e. 1× to 0.05× magnification). The blur and distortion due to the projection optics 114 is preferably a fraction of the pixel size. In one implementation, the pixel size may be, for example, 22.5 nanometers (nm). In such a case, the projection optics 114 preferably has aberrations and distortions of less than 10-20 nm.

The wafer stage 116 holds the target wafer. In one embodiment, the stage 116 is stationary during the lithographic projection. In another embodiment, the stage 116 is in linear motion during the lithographic projection. In the case where the stage 116 is moving, the pattern on the DPG 112 may be dynamically adjusted to compensate for the motion such that the projected pattern moves in correspondence with the wafer movement. In other embodiments, the REBL system 100 may be applied to other targets besides semiconductor wafers. For example, the system 100 may be applied to reticles. The reticle manufacturing process is similar to the process by which a single integrated circuit layer is manufactured.

Figure 2:
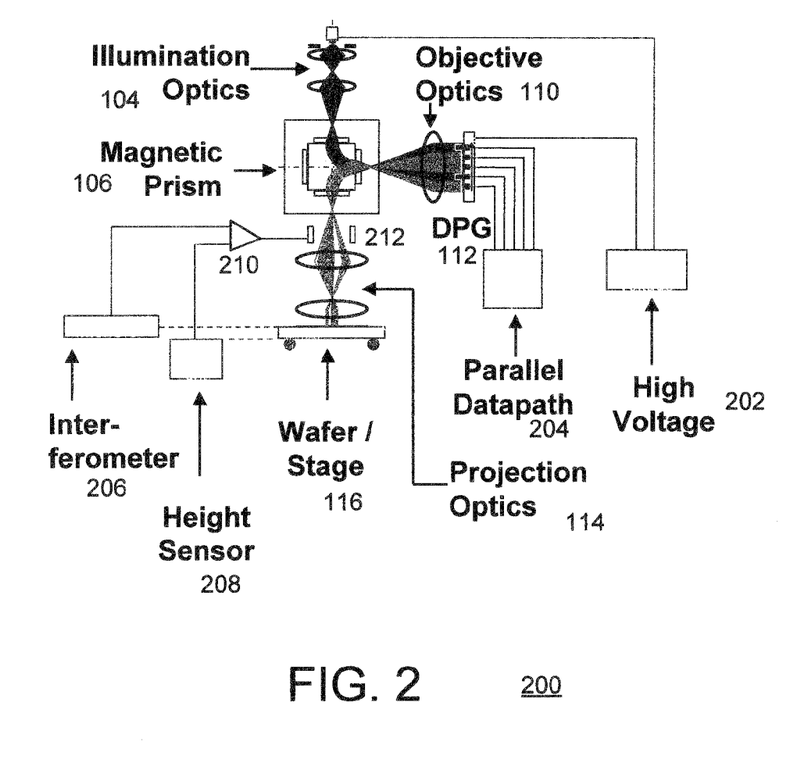
FIG. 2 is a schematic diagram of a maskless reflection electron beam projection lithography system showing further components in accordance with an embodiment of the invention.

FIG. 2 is a schematic diagram of a maskless reflection electron beam projection lithography system 200 showing further components in accordance with an embodiment of the invention. The additional components illustrated include a high voltage source 202, a parallel datapath 204, an interferometer 206, a height sensor 208, feedback circuitry 210, and beam deflectors 212.

The high voltage source 202 is shown as providing a high voltage to the source 102 and to the DPG 112. The voltage provided may be, for example, 50 kilovolts. The parallel data path 204 is configured to carry control signals to the DPG 112 for controlling the voltage on each pixel (so that it either absorbs electrons or reflects them).

In one embodiment, the control signals are adjusted so that the pattern moves electronically across the DPG pixel array in a manner that is substantially the same as the way signals move through a shift register and at a rate so as to match the linear movement of the wafer. In this embodiment, each exposed point on the wafer may receive reflected electrons from an entire column (or row) of DPG pixels, integrated over time. In one implementation of this embodiment, the DPG 112 is configured to resemble a static random access memory (SRAM) circuit.

In another embodiment, the control signals are such that the DPG 112 exposes one complete frame at a time. In this embodiment, each pixel on the DPG 112 exposes a corresponding pixel on the wafer. The pattern on the DPG 112 remains constant during the exposure of each frame. In one implementation of this embodiment, the DPG 112 is configured to resemble a dynamic random access memory (DRAM) circuit.

The interferometer 206 may be included to provide tight coupling and positional feedback between the electron beam location and the target on the wafer. In one embodiment, the optical beams are reflected off mirrors on the stage. The resulting interference pattern depends on the difference of the individual beam paths and allows accurate measurement of the stage and wafer position. Vertical positional information may be provided by a height sensor 208. The positional information may be fed back via feedback circuitry 210 so as to control beam deflectors 212. The deflectors 212 are configured to deflect the projected beam so as to compensate for vibrations and positional drift of the wafer.

Figure 3A:
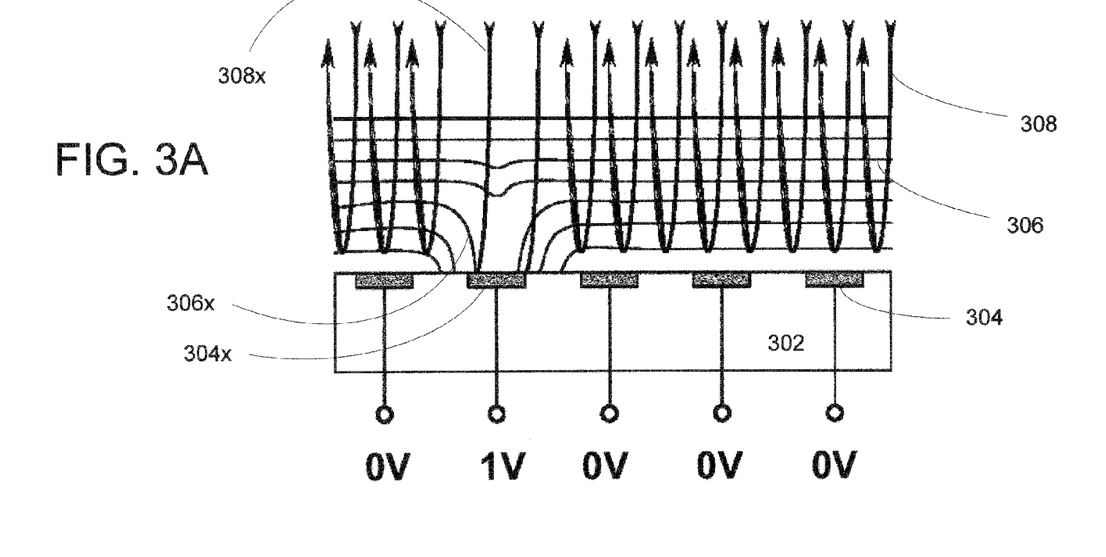
FIGS. 3A and 3B are diagrams illustrating the basic operation of a dynamic pattern generator.
Figure 3B:
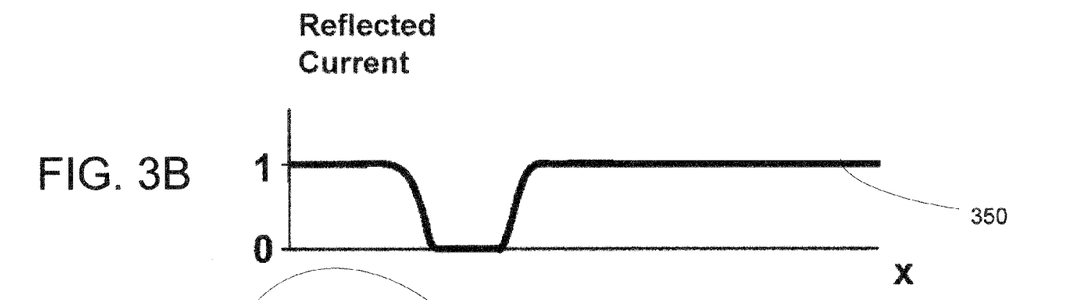

FIGS. 3A and 3B are diagrams illustrating the basic operation of a dynamic pattern generator. FIG. 3A shows a cross-section of a DPG substrate 302 showing a column (or row) of pixels. Each pixel includes a conductive area 304. A controlled voltage level is applied to each pixel. In the example illustrated in FIG. 3A, four of the pixels 304 are "on" (reflective mode) and are grounded (have 0 volts applied thereto), while one pixel (with conductive area labeled 304x) is "off" (absorptive mode) and has a positive voltage (1 volt) applied thereto. The specific voltages will vary depending on the parameters of the system. The resultant local electrostatic equipotential lines 306 are shown, with distortions 306x relating to "off" pixel shown. In this example, the incident electrons 308 approaching the DPG 112 come to a halt in front of and are reflected by each of the "on" pixels, but the incident electrons 308x are drawn into and absorbed by the "off" pixel. The resultant reflected current (in arbitrary units) is shown in FIG. 3B. As seen from FIG. 3B, the reflected current is "0" for the "off" pixel and "1" for the "on" pixels.

Figure 4:
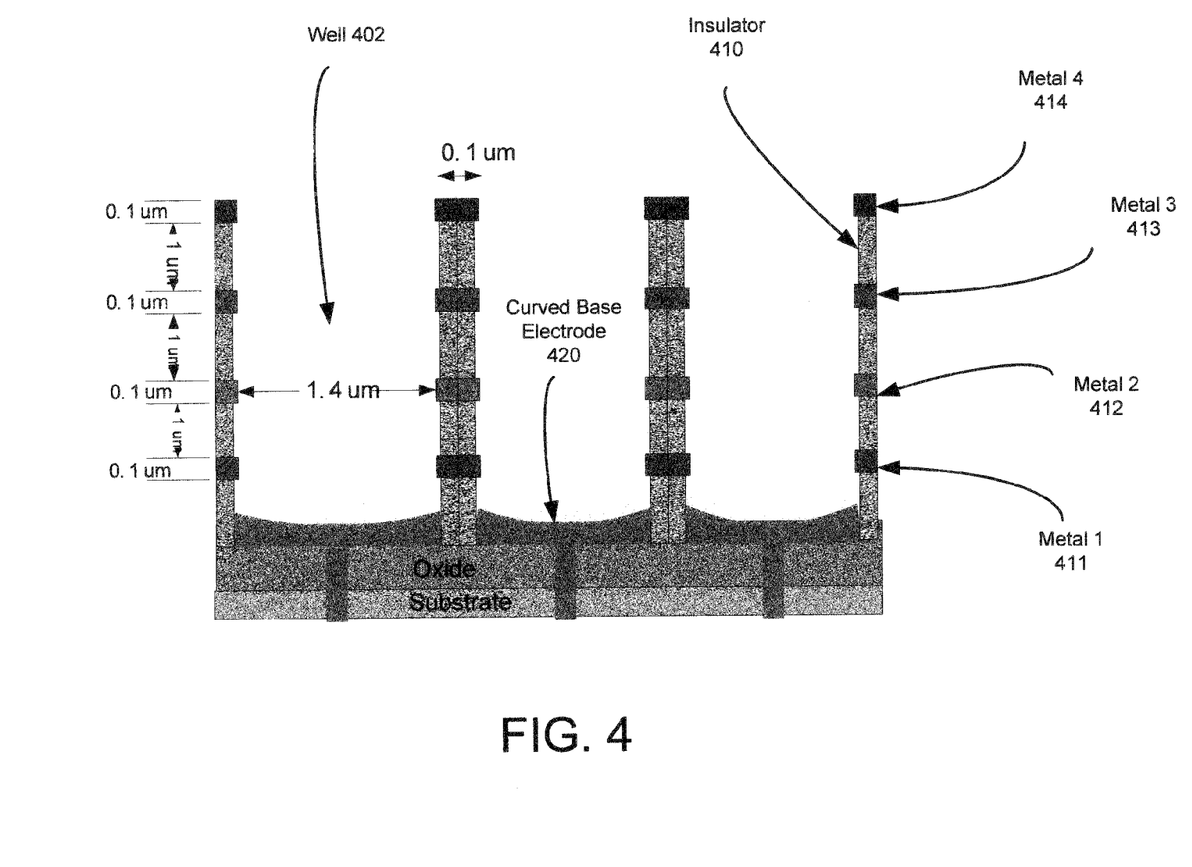
FIG. 4 is a schematic diagram showing a cross-sectional view of a well-based structure of a dynamic pattern generator in accordance with an embodiment of the invention.

FIG. 4 is a schematic diagram showing a cross-sectional view of a well-based pixel structure of a dynamic pattern generator in accordance with an embodiment of the invention. The well-based pixel structure includes multiple stacked electrodes configured to collect, focus, and extract electrons in accordance with an embodiment of the invention.

As shown, the sidewalls surrounding each well (cup) opening 402 comprises a stack with multiple conductive layers (for example, 411, 412, 413, and 414) separated by insulating layers 410. In addition, each well includes a base electrode 420 at the bottom of each well. The stacked electrode well structure may be fabricated on a silicon substrate (with an oxide layer on the substrate).

As shown in FIG. 4, a preferred embodiment may include the base electrode and four stacked electrodes (five electrodes total) in the well structure. Other embodiments may include a total number of electrodes in a range from three to ten electrodes in the well structure (i.e. a base electrode and from two to nine stacked electrodes). Each stacked electrode layer is, in effect, a microlens array fabricated on a silicon substrate.

In accordance with an embodiment of the invention, the base electrode 420 is formed to have an advantageously curved (cupped) surface. In an "off" mode or state, instead of absorbing electrons into the base electrode, the electrons may be reflected at a large angle so that they are not accepted by the numerical aperture of the projection optics. This advantageously lowers the voltage required to turn off the pixel.

The particular implementation shown in FIG. 4 is further described as follows. Other specific dimensions and voltages may be utilized in other implementations, depending on the particular system being implemented. As shown in FIG. 4, each well may be about 1.4 microns across. The first conductive stack layer (Metal 1) 411 (about 1 micron above and closest to the curved base electrode at the bottom of the well) and the second conductive stack layer (Metal 2) 412 (about 1 micron above the first conductive stack layer) may both have an applied voltage of negative 2.5 V. The negative voltages applied to these lower electrodes in the stack may be used to focus the electrons. The third conductive stack layer (Metal 3) 413 (about 1 micron above the second conductive stack layer) may have an applied voltage of positive 15V. This relatively strong positive voltage is applied to this electrode (which is just beneath the uppermost electrode) so as to both focus the incoming electrons by drawing them into the well and extracting the reflected electrons by drawing them out of the well. The fourth conductive layer (Metal 4) 414 (about 1 micron above the third conductive stack layer) may have an applied voltage of positive 0.5 volts. This relatively weak positive voltage applied to the uppermost conductive electrode to both screen the insulator from the incoming electron current and to deflect the incoming electrons with lower energy towards the inside of a nearest well. Finally, the base electrode 420 may have an applied voltage that is switched between 0 volts and negative 5 volts, for example, in order to achieve the "off" and "on" states, respectively.

Figure 5:
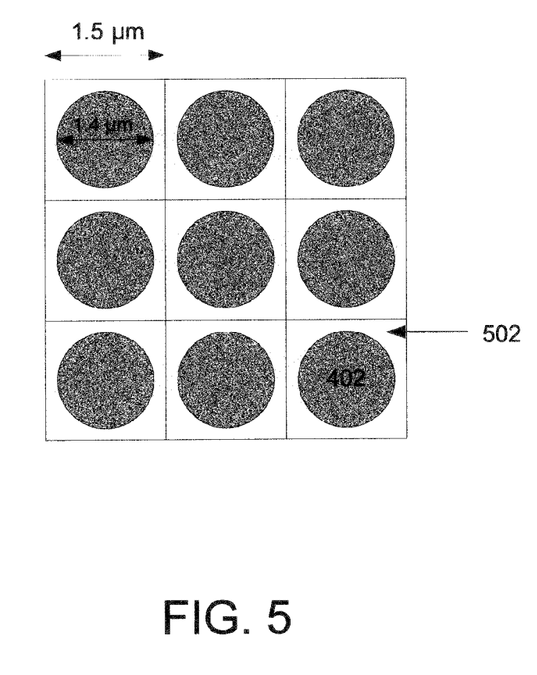
FIG. 5 is a schematic diagram showing a top down view of a portion of a dynamic pattern generator in accordance with an embodiment of the invention.

FIG. 5 is a schematic diagram showing a top down view of a portion of a dynamic pattern generator in accordance with an embodiment of the invention. This embodiment comprises well openings or cavities 402 that are round-shaped in a square grid. For example, the well openings may be 1.4 microns in diameter, and the pitch of the square grid may be 1.5 microns in diameter. As discussed above in relation to FIG. 4, the interstitial regions 502 including the sidewalls of the wells may comprise a metal-insulator-metal-insulator-metal-insulator-metal-insulator stack (tetrode or four electrode lens), and the bottom of each well 402 may comprise a curved base electrode. The voltage applied to each base electrode is individually controllable.

Figure 6:
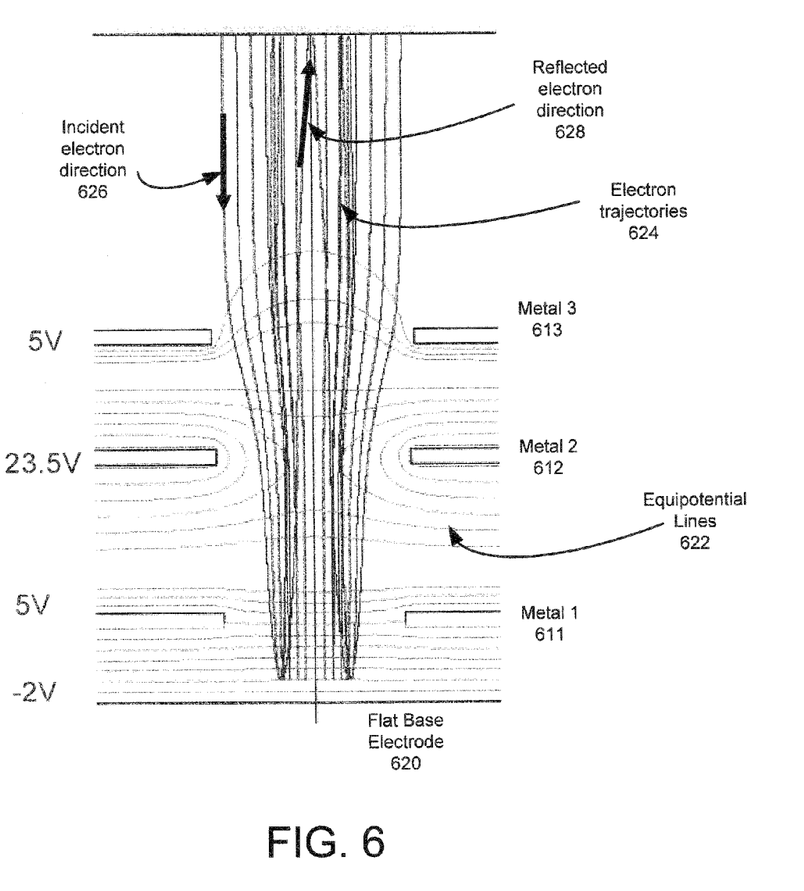
FIG. 6 is a schematic diagram depicting electron trajectory simulations of a well with a flat bottom electrode.

FIG. 6 is a schematic diagram depicting computer simulations of electron trajectories 624 for a well with a flat bottom electrode 620. As shown, for this simulation, the sidewall stack has three electrodes: Metal 1 611 (above the flat base electrode 620); Metal 2 612 (above Metal 1 611); and Metal 3 613 (above Metal 2 612). As further shown, the voltage applied to the flat base electrode 620 is negative 2 volts (−2 V), and the voltages applied to Metal 1 611, Metal 2 612, and Metal 3 613 are positive 5 volts (+5 V), positive 23.5 volts (+23.5 V), and positive 5 volts (+5 V), respectively.

In FIG. 6, an incident electron direction 626 is highlighted by an arrow for an electron closer to the sidewall of the well, and a corresponding reflected electron direction 628 is shown for such an electron. Note that the trajectory of the reflected electron is at an angle (rather than vertical or perpendicular) as it exits the well. In other words, the reflected electron exits the well at a much higher angle (relative to perpendicular) compared to the near perpendicular angle that the incident electron enters the well. The angular trajectory of the reflected electron is indicative of an undesirable lenslet aberration.

Figure 7:
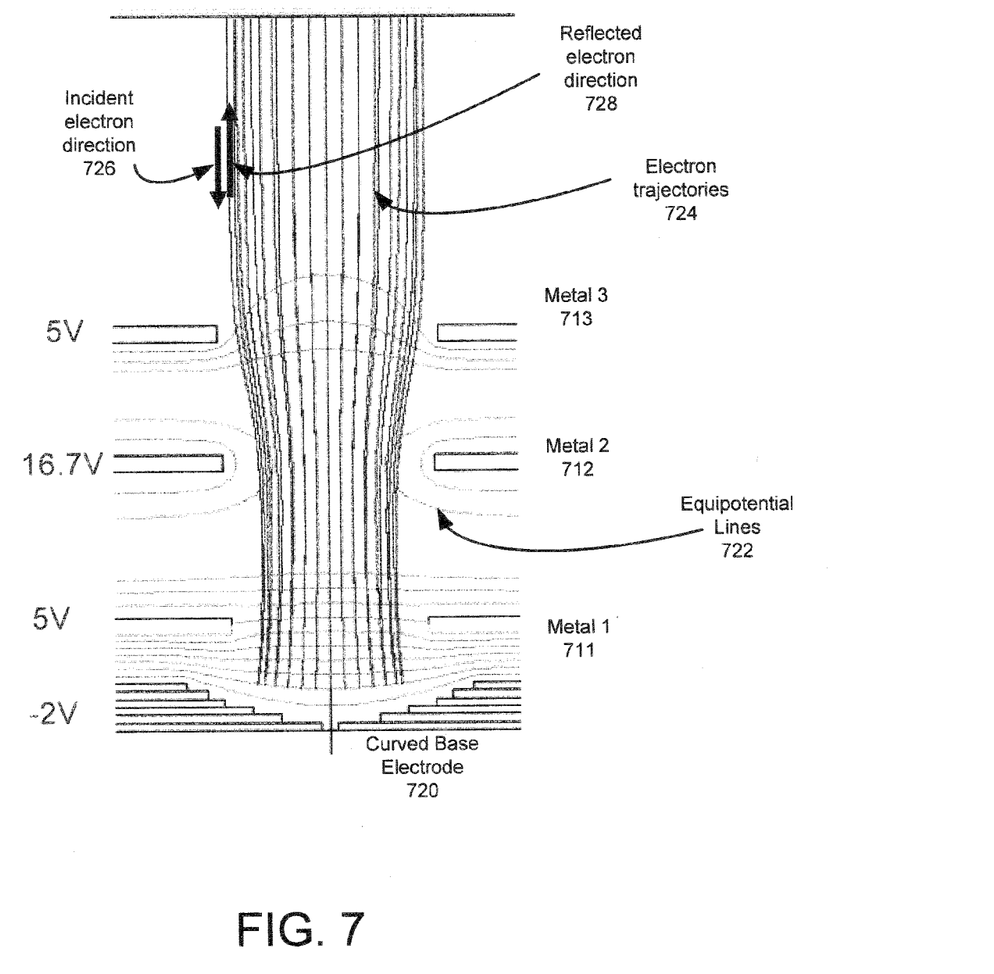
FIG. 7 is a schematic diagram depicting electron trajectory simulations of a well with a curved bottom electrode in accordance with an embodiment of the invention.

FIG. 7 is a schematic diagram depicting computer simulations of electron trajectories 724 a well with a curved base electrode 720 in accordance with an embodiment of the invention. As shown, for this simulation, the sidewall stack has three electrodes: Metal 1 711 (above the curved base electrode 720); Metal 2 712 (above Metal 1 711); and Metal 3 713 (above Metal 2 712). As further shown, the voltage applied to the curved base electrode 720 is negative 2 volts (−2 V), and the voltages applied to Metal 1 711, Metal 2 712, and Metal 3 713 are positive 5 volts (+5 V), positive 16.7 volts (+16.7 V), and positive 5 volts (+5 V), respectively. For this simulation, the curved base electrode 720 was approximated by a series of six stepped ringlets which provided a reasonably smooth equipotential from which the electrons were mirrored or reflected. Based on trial and error, it was determined by the applicants that a concave curvature was much superior to a convex curvature for the base electrode 720.

In FIG. 7, an incident electron direction 726 is highlighted by an arrow for an electron closer to the sidewall of the well, and a corresponding reflected electron direction 728 is shown for such an electron. Note that the trajectory of the reflected electron is vertical or perpendicular (not at an angle) as it exits the well. In other words, the reflected electron exits the well at a similar angle (near perpendicular) as the angle that the incident electron enters the well. This is indicative of substantially reduced lenslet aberration.

Figure 8:
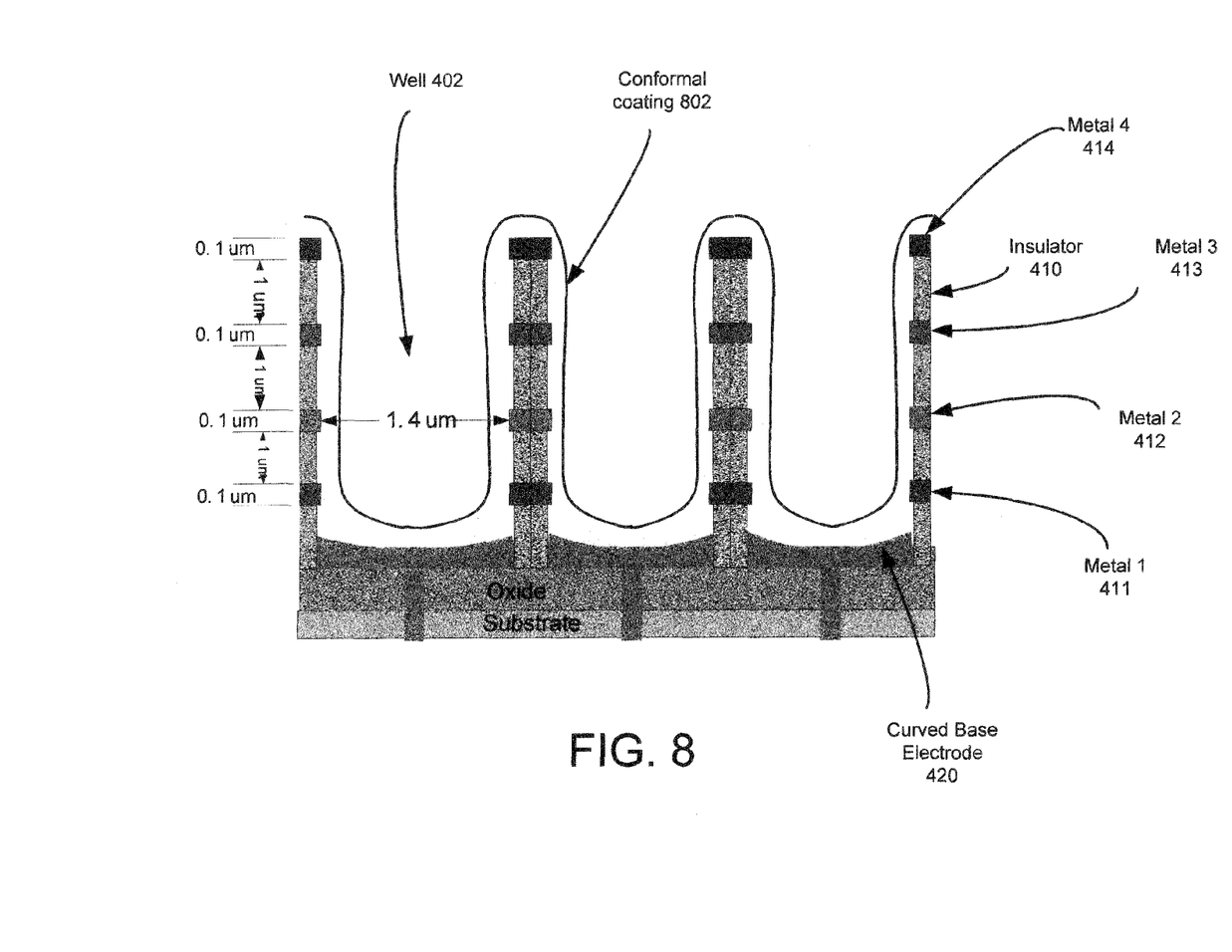
FIG. 8 is a schematic diagram showing a cross-sectional view showing wells covered by a conformal coating in accordance with an embodiment of the invention.

FIG. 8 is a schematic diagram showing a cross-sectional view showing the bottom and sidewalls of the wells 402 as covered by a conformal coating 802 in accordance with an embodiment of the invention. Applicants believe that such a conformal coating may advantageously serve to reduce or drain charge that otherwise builds up on the insulator layers (in between the electrodes) while being of sufficiently high resistance so as not to substantially perturb the electromagnetic field produced by the electrodes.

In accordance with an embodiment of the invention, the conformal coating may be applied using atomic layer deposition (ALD), and the materials deposited may be ZnO and $Al_2O_3$. Advantageously, the resistivity of the $ZnO/Al_2O_3$ material may be varied over a large range because the resistivity of Zn is on the order of 1E-3 ($10^{-3}$) Ohm-cm, and the resistivity of $Al_2O_3$ is on the order of 1E16 ($10^{16}$) Ohm-cm. In a specific example, a conformal coating with a sheet resistance on the order of 100 giga ohms per square (GOhms/Sq) may be formed by atomic layer deposition (ALD) using six pulses of ZnO, then one pulse of $Al_2O_3$, and repeating this forty times (such that in the end the coating includes forty super-layers, each super-layer including six layers of ZnO and one layer of $Al_2O_3$). The coating is then terminated with a film of ZnO used as the last deposited layer. Such a conformal coating is believed to be practical for a dynamic pattern generator with approximately one million wells (an array on the order of 1,000 by 1,000). More generally, applicants believe that a preferred range of sheet resistance for the conformal coating is from 10 to 100 GOhms/Sq. Other conformal coatings that may be used include an ALD coating of ZnO and ZrO, a carbon coating, and a diamond like carbon (DLC) coating.

Figure 9:
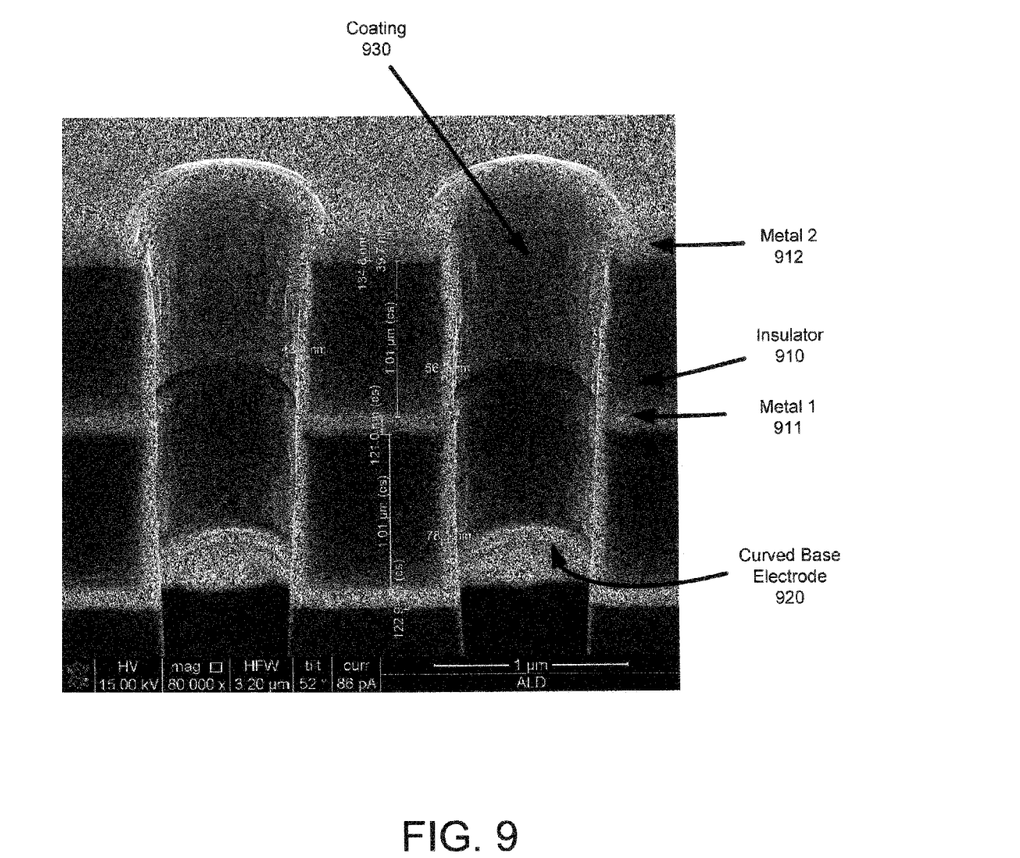
FIG. 9 is an electron micrograph showing a conformal coating which was deposited in a couple of wells of a dynamic pattern generator in accordance with an embodiment of the invention.

FIG. 9 is an electron micrograph showing a conformal coating 930 which was deposited in wells of a dynamic pattern generator in accordance with an embodiment of the invention. The electron micrograph provides a cross-sectional view (after etching to provide the cut-away view) which shows two stacked electrodes (Metal 1 911 and Metal 2 912) and a curved base electrode 920. Insulator layers 910 are shown between the electrodes. Further shown is the conformal coating 930 which was deposited by atomic layer deposition (ALD) within the wells.

FIG. 10 is a schematic diagram showing a top down schematic view of a portion of a shadow mask 120 in accordance with an embodiment of the invention. As seen, the shadow mask 120 includes an array of holes 1002 which may be illuminated on one side using a flood beam 118 of electrons from the source to create an array of beamlets on the other side. The array of holes 1002 is preferably configured so as to correspond to (match one hole to one well with) the array of wells of the dynamic pattern generator 112. Hence, for each well of the DPG 112, there is a corresponding hole in the shadow mask 120.

The shadow mask 120 is configured to advantageously reduce the electron-beam illumination of the interstitial regions 502 between the wells 402 of the DPG 112. Applicants believe that reducing the electron-beam illumination of the interstitial regions has several advantages. First, the amount of electrons emitted from the interstitial regions is reduced so as to decrease background noise or loss of contrast in the signals detected by the DPG 112. Second, the removal of electrons from the incident beam by the shadow mask 120 causes decreased electron-electron interactions within the beam and so results in a decrease in energy spread or blur in the beam. Third, there is a reduction in the amount of electrons illuminating the periphery of the wells of the DPG 112 because each illumination beamlet may be created so as to be somewhat smaller than the well size when it reaches the DPG 112. Such electrons illuminating the periphery of the wells are frequently reflected outside of the acceptance angle of the projection optics. Hence, reducing such peripheral electrons reduces the background noise and increases the contrast of the system.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus of a dynamic pattern generator for reflection electron beam lithography, the apparatus comprising:
   a plurality of base electrodes in a two-dimensional array;
   an insulating border surrounding each base electrode so as to electrically isolate the base electrodes from each other; and
   a sidewall surrounding each base electrode,
   wherein the sidewall comprises a plurality of stacked electrodes which are separated by insulating layers; further comprising a conformal coating over the base electrodes and sidewalls; and
   further wherein the base electrodes are shaped so as to be concave.

2. The apparatus of claim 1, wherein the plurality of stacked electrodes includes at least two electrodes.

3. The apparatus of claim 2, wherein the plurality of stacked electrodes includes no more than nine electrodes.

4. The apparatus of claim 1, wherein the conformal coating has a sheet resistance from 10 to 100 giga Ohms per square.

5. The apparatus of claim 1, wherein the conformal coating comprises ZnO and $Al_2O_3$.

6. The apparatus of claim 1, wherein the conformal coating comprises ZnO and ZrO.

7. An apparatus for reflection electron beam lithography, the apparatus comprising:
- an electron source configured to emit electrons;
- illumination electron-optics configured to receive the emitted electrons and form an array of incident electron beamlets;
- a shadow mask configured to form the array of incident electron beamlets;
- an electron reflective patterned structure having a plurality of pixel pads in an array and an insulating border surrounding each pixel pad so as to electrically isolate the pixel pads from each other; and
- a stage to hold a target substrate,
- wherein the shadow mask comprises an array of holes which correspond one-to-one with the array of pixel pads of the electron reflective patterned structure.

8. The apparatus of claim 7, wherein the electron reflective patterned structure comprises a dynamic pattern generator which is configured to apply voltages to the pixel pads on an individually controllable basis.

9. The apparatus of claim 8, wherein incident electron beamlets are reflected to the target substrate by pixel pads having a lower or more negative voltage level applied thereto and are deflected or absorbed by pixel pads having a higher or more positive voltage level applied thereto.

10. The apparatus of claim 7, wherein the pixel pads are shaped to be concave.

11. The apparatus of claim 7, further comprising sidewalls surrounding each pixel pad, wherein the sidewalls include at least two metal layers and insulating layers to isolate said metal layers from each other and from the pixel pad.

12. An apparatus of a dynamic pattern generator for reflection electron beam lithography, the apparatus comprising:
- a plurality of base electrodes in a two-dimensional array;
- an insulating border surrounding each base electrode so as to electrically isolate the base electrodes from each other;
- a sidewall surrounding each base electrode, wherein the sidewall comprises a plurality of stacked electrodes which are separated by insulating layers, and
- a conformal coating over the base electrodes and sidewalls.

13. The apparatus of claim 12, wherein the conformal coating has a sheet resistance from 10 to 100 giga Ohms per square.

14. The apparatus of claim 12, wherein the conformal coating comprises ZnO and $Al_2O_3$.

15. The apparatus of claim 12, wherein the conformal coating comprises ZnO and ZrO.

* * * * *